(12) United States Patent
Yeon et al.

(10) Patent No.: US 11,302,745 B2
(45) Date of Patent: Apr. 12, 2022

(54) LED MODULE AND METHOD OF FABRICATING THE SAME

(71) Applicant: SAMSUNG ELECTRONICS CO., LTD., Suwon-si (KR)

(72) Inventors: Jihye Yeon, Suwon-si (KR); Hanul Yoo, Bucheon-si (KR); Jihoon Yun, Suwon-si (KR); Suhyun Jo, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 3 days.

(21) Appl. No.: 16/901,451

(22) Filed: Jun. 15, 2020

(65) Prior Publication Data

US 2021/0126045 A1    Apr. 29, 2021

(30) Foreign Application Priority Data

Oct. 29, 2019    (KR) .......................... 10-2019-0135447

(51) Int. Cl.
  *H01L 27/15*    (2006.01)
  *H01L 33/50*    (2010.01)
  (Continued)

(52) U.S. Cl.
  CPC ............ *H01L 27/156* (2013.01); *H01L 24/08* (2013.01); *H01L 24/89* (2013.01); *H01L 25/18* (2013.01);
  (Continued)

(58) Field of Classification Search
  CPC ....... H01L 27/156; H01L 24/08; H01L 24/89; H01L 25/18; H01L 27/124;
  (Continued)

(56) References Cited

U.S. PATENT DOCUMENTS 6,372,608 B1    4/2002    Shimoda et al.
6,645,830 B2    11/2003   Shimoda et al.
(Continued)

FOREIGN PATENT DOCUMENTS

JP    2008-71910 A    3/2008
JP    2011-138836 A   7/2011
KR    10-1865919 B1   6/2018

*Primary Examiner* — Bo B Jang
(74) *Attorney, Agent, or Firm* — Lee IP Law, PC

(57) ABSTRACT

An LED module includes light emission windows; LED cells corresponding to the light emission windows, the LED cells each including a lower and upper light emitting structure, the lower light emitting structure having an upper surface with first and second regions and having a first conductivity-type semiconductor layer, the upper light emitting structure being on the first region of the lower light emitting structure and having a second conductivity-type semiconductor layer, the LED cells including an active layer between the first and second conductivity-type semiconductor layers; a protective insulating film on a side surface of the lower light emitting structure and on the second region; a light blocking film on the protective insulating film, between the LED cells; a gap-fill insulating film on the protective insulating film between the LED cells and contacting a side surface of the upper light emitting structure; a first electrode; and a second electrode.

20 Claims, 18 Drawing Sheets

(51) Int. Cl.
*H01L 33/32* (2010.01)
*H01L 33/38* (2010.01)
*H01L 33/46* (2010.01)
*H01L 33/62* (2010.01)
*H01L 25/18* (2006.01)
*H01L 27/12* (2006.01)
*H01L 33/00* (2010.01)
*H01L 23/00* (2006.01)

(52) U.S. Cl.
CPC ........ *H01L 27/124* (2013.01); *H01L 27/1248* (2013.01); *H01L 33/0075* (2013.01); *H01L 33/32* (2013.01); *H01L 33/382* (2013.01); *H01L 33/46* (2013.01); *H01L 33/502* (2013.01); *H01L 33/505* (2013.01); *H01L 33/62* (2013.01); *H01L 2224/08146* (2013.01); *H01L 2224/08147* (2013.01); *H01L 2224/80001* (2013.01); *H01L 2933/0016* (2013.01); *H01L 2933/0025* (2013.01); *H01L 2933/0041* (2013.01); *H01L 2933/0066* (2013.01)

(58) Field of Classification Search
CPC . H01L 27/1248; H01L 33/0075; H01L 33/32; H01L 33/382; H01L 33/46; H01L 33/502; H01L 33/505; H01L 33/62; H01L 2224/08146; H01L 2224/08147; H01L 2224/80001; H01L 2933/0016; H01L 2933/0025; H01L 2933/0041; H01L 2933/0066
See application file for complete search history.

(56) References Cited

U.S. PATENT DOCUMENTS

| | | |
|---|---|---|
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,415,656 B2 | 4/2013 | Aldaz et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 9,391,238 B2 | 7/2016 | Kim et al. |
| 9,954,028 B2 | 4/2018 | Yeon et al. |
| 2007/0194328 A1* | 8/2007 | Komada ................. H01L 33/32 257/79 |
| 2014/0209955 A1* | 7/2014 | Kim ........................ H01L 33/38 257/99 |
| 2017/0207249 A1* | 7/2017 | Rhee ..................... G09G 3/3233 |
| 2018/0047780 A1* | 2/2018 | Yeon ..................... H01L 27/156 |
| 2019/0371779 A1 | 12/2019 | Yeon et al. |

* cited by examiner

LED MODULE AND METHOD OF FABRICATING THE SAME

CROSS-REFERENCE TO RELATED APPLICATION

Korean Patent Application No. 10-2019-0135447, filed on Oct. 29, 2019, in the Korean Intellectual Property Office, and entitled: "LED Module and Method of Fabricating the Same," is incorporated by reference herein in its entirety.

BACKGROUND

1. Field

Embodiments relate to a light emitting diode (LED) module and a method of fabricating the LED module.

2. Description of the Related Art

Semiconductor light emitting diodes (LEDs) are not only used as light sources for lighting devices but also as light sources for various electronic products. In detail, semiconductor LEDs are widely used as light sources for various display devices such as TVs, mobile phones, PCs, notebook PCs, PDA and the like.

Display devices may be composed of a display panel and a backlight composed of a liquid crystal display (LCD), but in recent years, LED devices have been used instead and have been developed in a form in which a backlight is not separately required. Such a display device may not only be compact, but also can implement a high brightness display device having excellent light efficiency compared to a related art LCD. Such a display device is composed of a plurality of display modules constituting each pixel.

SUMMARY

Embodiments are directed to a light emitting diode (LED) module, including: a substrate having a plurality of light emission windows; a plurality of LED cells disposed on the substrate to correspond to the plurality of light emission windows, respectively, the plurality of LED cells each including a lower light emitting structure and an upper light emitting structure, the lower light emitting structure having an upper surface divided into a first region and a second region and having at least a first conductivity-type semiconductor layer, the upper light emitting structure being disposed on the first region of the lower light emitting structure and having at least a second conductivity-type semiconductor layer, the plurality of LED cells including an active layer between the first conductivity-type semiconductor layer and the second conductivity-type semiconductor layer; a protective insulating film disposed on a side surface of the lower light emitting structure and on the second region; a light blocking film disposed on the protective insulating film, between the plurality of LED cells; a gap-fill insulating film disposed on the protective insulating film to fill between the plurality of LED cells and in contact with a side surface of the upper light emitting structure; a first electrode connected to the first conductivity-type semiconductor layer of the lower light emitting structure; and a second electrode connected to the second conductivity-type semiconductor layer of the upper light emitting structure.

Embodiments are also directed to a light emitting diode (LED) module, including a first substrate structure including a substrate having a plurality of light emission windows, a plurality of LED cells disposed on the substrate to correspond to the plurality of light emission windows, respectively, a gap-fill insulating film filled between the plurality of LED cells and disposed on the plurality of LED cells, a first planarization insulating layer disposed on the gap-fill insulating film and having a first surface that is substantially flat, and connection electrodes connected to the plurality of LED cells through the first planarization insulating layer, respectively, and exposed to the first surface of the first planarization insulating layer; and a second substrate structure disposed on the first substrate structure, the second substrate structure including a second planarization insulating layer having a second surface that is substantially flat, the second surface being bonded to the first surface, the second substrate structure including a driving circuit having a plurality of TFT cells and metal wires connected to the driving circuit, exposed to the second surface of the second planarization insulating layer, and bonded to the connection electrodes, respectively. The plurality of LED cells may include a lower light emitting structure and an upper light emitting structure, the lower light emitting structure having an upper surface divided into a first region and a second region and having a first conductivity-type semiconductor layer, the upper light emitting structure being disposed on the first region of the lower light emitting structure and having an active layer and a second conductivity-type semiconductor layer. The first substrate structure may further include a protective insulating film disposed on a side surface of the lower light emitting structure and on the second region, and a light blocking film disposed on the protective insulating film, between the plurality of LED cells. The gap-fill insulating film may be disposed on the protective insulating film and surrounds the upper light emitting structure while being in contact with a side surface of the upper light emitting structure.

Embodiments are also directed to a light emitting diode (LED) module, including: a substrate having a plurality of light emission windows; a plurality of LED cells disposed on the substrate to correspond to the plurality of light emission windows, respectively, the plurality of LED cells each including a first conductivity-type semiconductor layer having an upper surface divided into a first region and a second region, and an active layer and a second conductivity-type semiconductor layer sequentially stacked on the first region; a protective insulating film disposed on a side surface of the first conductivity-type semiconductor layer and on the second region; a light blocking film disposed on the protective insulating film, between the plurality of LED cells; and a gap-fill insulating film disposed on the protective insulating film, the gap-fill insulating film filling between the plurality of LED cells and being in contact with side surfaces of the active layer and the second conductivity-type semiconductor layer.

Embodiments are also directed to a method of fabricating an LED module, including: forming a semiconductor structure having a first conductivity-type semiconductor layer on a substrate; dividing the semiconductor structure into a plurality of lower light emitting structures by forming an isolation region to which a surface of the substrate is exposed; forming a protective insulating film on upper and side surfaces of the plurality of lower light emitting structures and a surface of the substrate exposed to the isolation region; forming a light blocking film on the protective insulating film corresponding to the isolation region; forming a gap-fill insulating film on the protective insulating film to fill the isolation region; partially removing the gap-fill insulating film and the protective insulating film to expose a portion of an upper surface of each of the plurality of lower light emitting structures; forming an upper light emitting structure having an active layer and a second conductivity-type semiconductor layer in an exposed area of an upper surface of each of the plurality of lower light emitting structures; and forming a first electrode and a second electrode connected to the first conductivity-type semiconductor layer of the lower light emitting structure and the second conductivity-type semiconductor layer of the upper light emitting structure, respectively.

BRIEF DESCRIPTION OF DRAWINGS

Features will become apparent to those of skill in the art by describing in detail example embodiments with reference to the attached drawings in which:

FIGS. 5A to 12A are plan views of stages in a method of fabricating an LED module according to an example embodiment;

FIGS. 5B to 12B are cross-sectional views of stages in a method of fabricating an LED module according to an example embodiment;

DETAILED DESCRIPTION

Hereinafter, example embodiments will be described with reference to the accompanying drawings.

Figure 1:
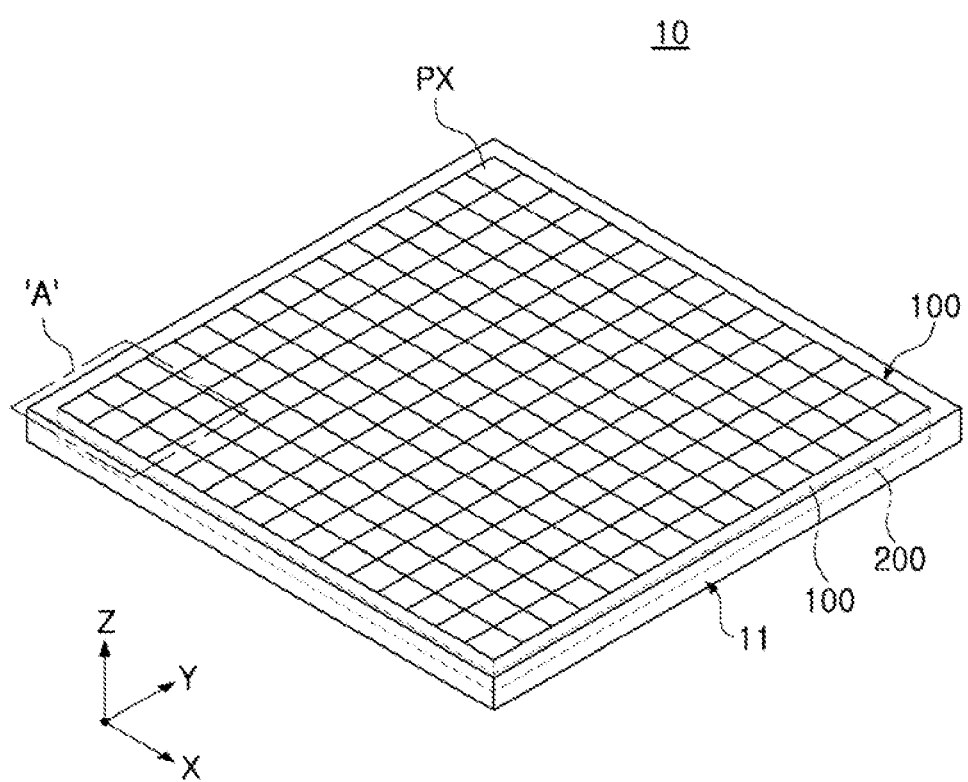
FIG. 1 is a schematic perspective view of a display panel having an LED module according to an example embodiment.
Figure 2:
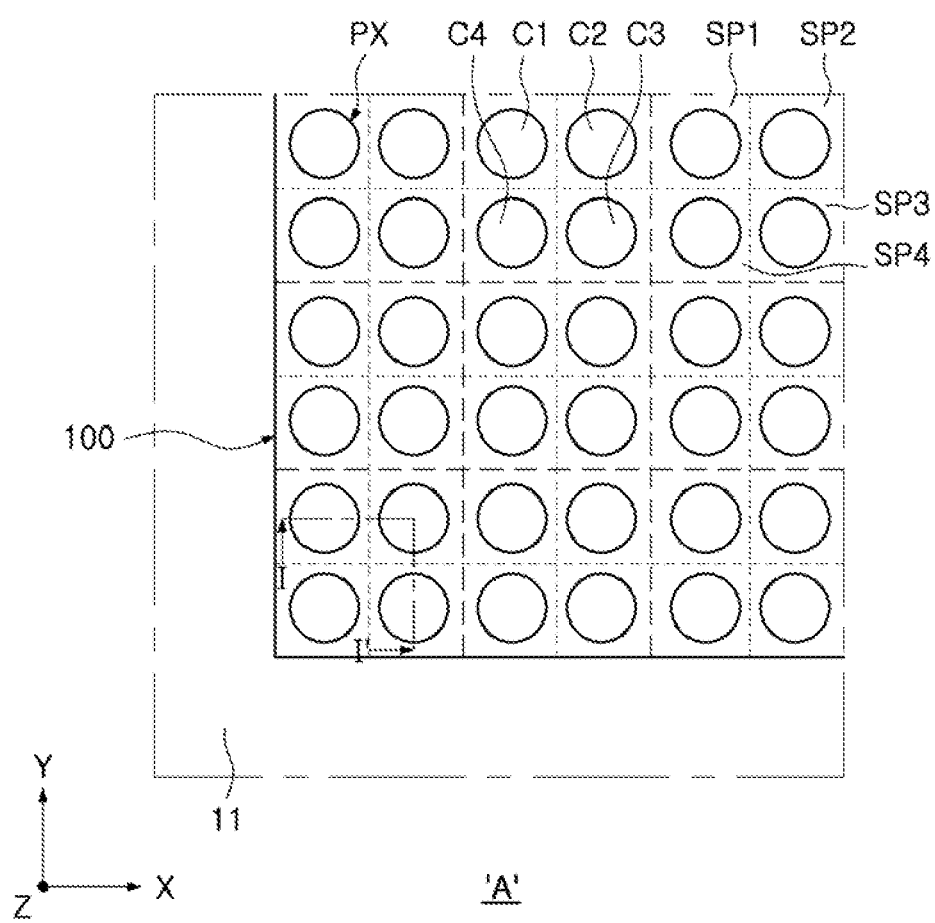
FIG. 2 is an enlarged plan view of portion A of FIG. 1.
Figure 3:
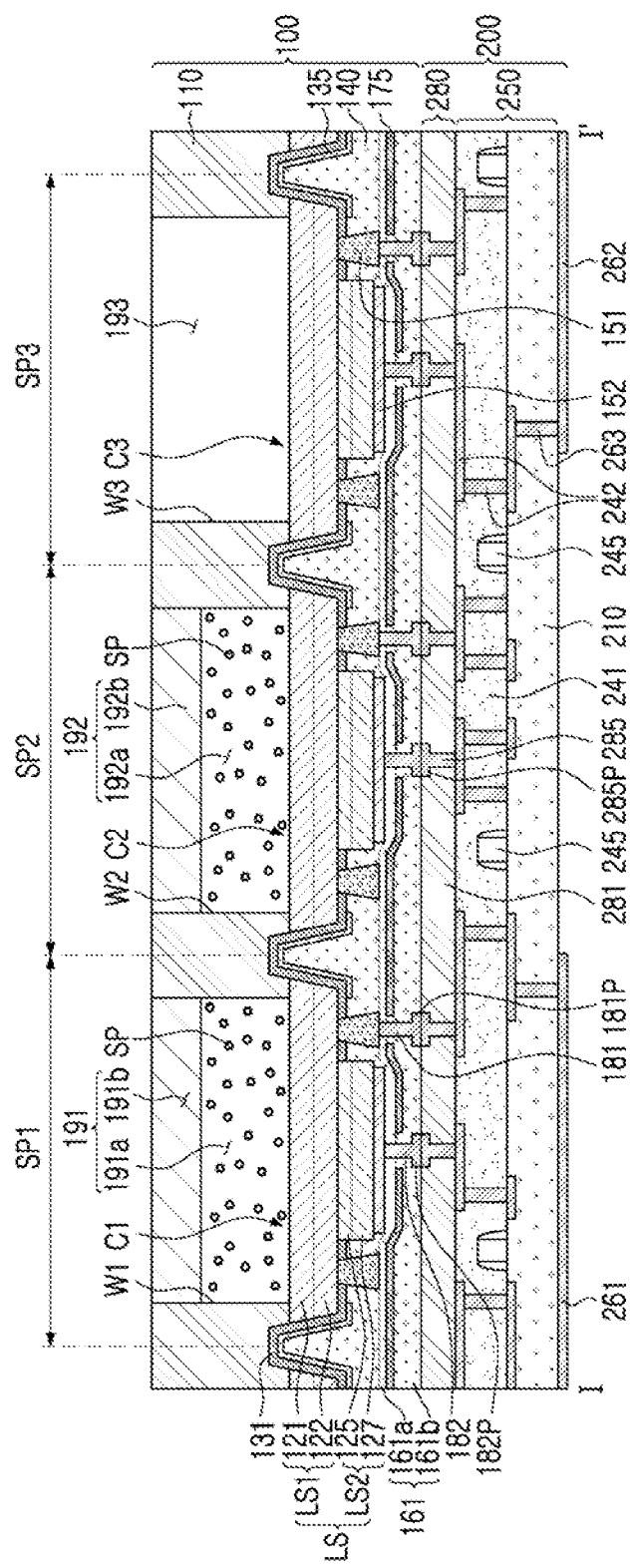
FIG. 3 is a side cross-sectional view taken along line I-I' of FIG. 2.

FIG. 1 is a schematic perspective view of a display panel having an LED module according to an example embodiment, FIG. 2 is an enlarged plan view of portion A of FIG. 1, and FIG. 3 is a side cross-sectional view taken along line I-I' of FIG. 2.

Referring to FIGS. 1 and 2, a display panel 10 (also be referred to as an "LED module for display") according to an example embodiment may include a circuit board 200 (also, referred to as a "second substrate structure") including a TFT cell, and an LED module 100 (also, referred to as a "first substrate structure") disposed on the circuit board 200 and provided with a plurality of pixels PX arranged thereon. The display panel 10 may further include a frame 11 surrounding the circuit board 200 and the LED module 100.

Each pixel PX may include first to fourth sub-pixels SP1, SP2, SP3, and SP4. The first to fourth sub-pixels SP1, SP2, SP3, and SP4 may include LED cells C1, C2, C3, and C4 capable of emitting light having a specific wavelength, respectively. For example, the LED cells C1, C2, C3, and C4 may include a light emitting structure LS that may emit blue light or ultraviolet light.

The first to fourth sub pixels SP1, SP2, SP3, and SP4 may be configured such that at least a portion of the first to fourth sub-pixels SP1, SP2, SP3, and SP4 may emit light of different colors to display a color image. For example, the first to third sub-pixels SP1, SP2, and SP3 may be configured to emit red light, green light, and blue light, respectively, and the fourth sub-pixel SP4 may be configured to emit one of the three colors, for example, green light or white light.

In the present example embodiment, the pixel PX is illustrated in the form of four sub-pixels SP1, SP2, SP3, and SP4, but the pixel PX may include, for example, three sub-pixels that are configured to emit different colors, for example, red, green and blue light. The color of the light emitted from the first to fourth sub-pixels SP1, SP2, SP3, and SP4 may be determined by the LED cells C1 to C4 and/or wavelength conversion units 191, 192 and 193 (see FIG. 3), which will be described in more detail with reference to FIG. 3.

As illustrated in FIG. 1, the pixel (PX) array in the present example embodiment is illustrated in the form of 15×15, but the array may be implemented as any appropriate number of columns and rows, for example, in the form of 1,024×768. The pixel array may have a different arrangement depending on a desired resolution. The LED module 100 illustrated in FIG. 1 may be manufactured by preparing a block body of a pixel array of a relatively small unit (e.g., 5×5) and then transferring respective block bodies onto the circuit board 200 to arrange the block bodies.

The frame 11 may be disposed around the LED module 100 and serve as a guide defining an arrangement space of an array of pixels PX. The frame 11 may include one or more of, for example, a polymer, a ceramic, a semiconductor, or a metal. The frame 11 may include a black matrix, a white matrix, or other colored structure may be used depending on the use of the product. For example, the white matrix may include a reflective material or a light scattering material.

Although the display panel 10 illustrated in the present example embodiment is illustrated as having a flat structure having a quadrangular shape, the display panel 10 may have a structure having a different shape, for example, the display panel 10 may have a structure with a curved profile by forming the circuit board TFS using a flexible substrate.

FIG. 3 is a side cross-sectional view of the LED module illustrated in FIG. 2 taken along line I-I'.

The cross-section illustrated in FIG. 3 illustrates an LED structure constituting one pixel, and in detail, illustrates cross sections of the first to third LED cells C1, C2, and C3 corresponding to the first to third sub pixels SP1, SP2 and SP3, respectively.

In FIG. 3, the fourth LED cell C4 is omitted, but the fourth LED cell C4 may have a structure similar to that of the first to third LED cells C1, C2, and C3. The fourth LED cell C4 may be configured to emit light of the same color as the light of another LED cell, and may be understood to have the same structure as the other LED cells.

Referring to FIG. 3, the display panel 10 may include the LED module 100 disposed on the circuit board 200. The LED module 100 may be implemented as a first substrate structure having an LED array. The circuit board 200 may be implemented as a second substrate structure bonded to the first substrate structure. The first substrate structure and the second substrate structure may be integrally bonded to each other by a wafer bonding method such as fusion bonding or hybrid bonding at a wafer level (see FIG. 16).

The LED module 100 may include a substrate 110 having a plurality of light emission windows W1, W2, and W3, and first to third LED cells C1, C2, and C3 disposed on the substrate 110 to correspond to the plurality of light emission windows W1, W2, and W3, respectively.

The first to third LED cells C1, C2, and C3 may include a light emitting structure LS configured to emit light of a specific wavelength. The light emitting structure LS may include a semiconductor stack obtained by the same growth process. The light emitting structure LS may be obtained by, for example, a divided growth process.

The light emitting structure LS may include a lower light emitting structure LS1 having an upper surface divided into a first region and a second region, and an upper light emitting structure LS2 disposed on the first region of the lower light emitting structure LS1. The lower light emitting structure LS1 may include at least a first conductivity-type semiconductor layer 122. The upper light emitting structure LS2 may include at least a second conductivity-type semiconductor layer 127. In the present example embodiment, the lower light emitting structure LS1 further includes an undoped semiconductor layer 121 positioned between the first conductivity-type semiconductor layer 122 and the substrate 110, and the upper light emitting structure LS2 includes an active layer 125 and the second conductivity-type semiconductor layer 127. In another example embodiment (see FIG. 17), the upper light emitting structure LS2 may further include a portion of the first conductivity-type semiconductor layer 122, and in another example embodiment, the lower light emitting structure LS1 may further include an active layer 125.

In plan view, the second region may have a shape surrounding at least a portion of the first region. In the present example embodiment, the second region is illustrated as having a shape surrounding the entirety of the first region (see FIG. 8A).

The substrate 110 may be a growth substrate for growing the semiconductor layers 121, 122, 125, and 127 for the light emitting structure LS. For example, the substrate 110 may include an insulating, conductive, or semiconductor substrate. In the present example embodiment, the substrate 110 may be a substrate capable of blocking light and a substrate to which processing for the light emission windows W1, W2, and W3 may be easily applied. The substrate 110 may include a silicon substrate.

The undoped semiconductor layer 121 may include GaN, and the first conductivity-type semiconductor layer 122 may have a nitride semiconductor satisfying an n-type $In_xAl_yGa_{1-x-y}N$ ($0 \leq x < 1$, $0 \leq y < 1$, $0 \leq x+y < 1$), and in this case, the n-type impurity may include silicon (Si), germanium (Ge), selenium (Se), or tellurium (Te). The active layer 125 may have a multi-quantum well (MQW) structure in which a quantum well layer and a quantum barrier layer are alternately stacked. For example, the quantum well layer and the quantum barrier layer may be layers of $In_xAl_yGa_{1-x-y}N$ ($0 \leq x \leq 1$, $0 \leq y \leq 1$, $0 \leq x+y \leq 1$) having different compositions. The quantum well layer may be an $In_xGa_{1-x}N$ ($0 \leq x \leq 1$) layer, and the quantum barrier layer may be a GaN or AlGaN layer. The active layer 125 may be configured to emit substantially the same light. For example, the active layer 125 may be configured to emit blue light (e.g., 440 nm to 460 nm) or ultraviolet light or near ultraviolet light (e.g., 380 nm to 440 nm). The second conductivity-type semiconductor layer 127 may include a nitride semiconductor layer satisfying p-type $In_xAl_yGa_{1-x-y}N$ ($0 \leq x \leq 1$, $0 \leq y \leq 1$, $0 \leq x+y \leq 1$), and in this case, the p-type impurity may include magnesium (Mg), zinc (Zn), or beryllium (Be).

As illustrated in FIG. 3, the substrate 110 may have a partition structure that provides a plurality of light emission windows W1, W2, and W3. As described above, the plurality of light emission windows W1, W2, and W3 may be formed on the substrate 110 to correspond to the plurality of LED cells, respectively.

As illustrated in FIG. 3, a light adjusting unit may be disposed on at least a portion of the first to third light emission windows W1, W2, and W3. For example, first and second light adjusting units 191 and 192 may convert a portion of the light emitted from first and second LED cells C1 and C2 into light of different colors, respectively. For example, the first to third LED cells C1, C2, and C3 may be configured to emit blue light, and the first and second wavelength conversion units 191a and 192a may be configured to convert red light and green light, respectively. The third light emission window W3 may be filled with a protective transparent resin as the light adjusting unit 193 to emit blue light.

The first and second wavelength conversion units 191b and 192b may include first and second wavelength conversion materials P1 and P2, respectively. The first and second wavelength conversion units 191b and 192b may be formed by, for example, dispensing a light-transmissive liquid resin mixed with a wavelength conversion material such as a phosphor or a quantum dot into the first and second light emission windows W1 and W2, respectively. In another example embodiment, the first and second wavelength conversion units 191b and 192b may be provided in the form of a wavelength conversion film.

The first and second light adjusting units 191 and 192 may be disposed on the first and second wavelength conversion units 191a and 192a, respectively, and may further include first and second light filter layers 191a and 192a that block unconverted blue light. The color purity of light emitted from the first and second light emission windows W1 and W2 may be increased by the first and second light filter layers 191b and 192b.

A protective insulating film 131 may be disposed on a side surface of the lower light emitting structure LS1, and on the second region. The protective insulating film 131 may also extend to an area of the substrate 110 positioned between the lower light emitting structures LS1 along the side surface of the lower light emitting structure LS1. The protective insulating film 131 may include, for example, at least one of SiO, SiN, SiCN, SiOC, SiON, and SiOCN. The protective insulating film 131 may be formed relatively conformally.

A light blocking film 135 may be disposed on an area of the protective insulating film 131 positioned between the plurality of LED cells C1, C2, and C3. The light blocking film 135 may partially extend to the area of the protective insulating film 131 disposed on the upper surface of the lower light emitting structure LS1. The light blocking film 135 may be employed to have a structure for preventing optical interference between the plurality of LED cells C1, C2, and C3. For example, the light blocking film 135 may include polysilicon. The light blocking film 135 may be formed of a light reflection layer. For example, the light blocking film 135 may include a reflective metal layer, a distributed Bragg reflection (DBR) layer, or an omni-directional reflection (ODR) layer. The reflective metal layer may include silver (Ag), nickel (Ni), or aluminum (Al).

The gap-fill insulating film 140 may be disposed on the protective insulating film 131 to fill gaps between the LED cells C1, C2, and C3. The gap-fill insulating film 140 may contact the side surface of the upper light emitting structure LS2 and surround the upper light emitting structure LS2. The top surface of the gap-fill insulating film 140 may be the same as or higher than the top surface of the upper light emitting structure LS2.

The gap-fill insulating film 140 may be formed before the first and second electrodes 151 and 152 and the active layer 165 are formed. Thus, the gap-fill insulating film 140 may be formed at a relatively high temperature of 600° C. or higher, for example, 800° C. In addition, the space between the lower light emitting structures LS1 may have a lower depth than the space between the entire light emitting structures LS. Thus, a relatively easy gap fill process may be performed. Therefore, generation of voids or seams in the gap-fill insulating film 140 may be suppressed, and mechanical reliability may be improved.

The gap-fill insulating film 140 may include, for example, a silicon oxide or a silicon oxide-based insulating material. For example, the gap-fill insulating film 140 may be formed of TetraEthyl Ortho Silicate (TEE), Undoped Silicate Glass (USG), or PhosphoSilicate Glass (PSG), Borosilicate Glass (BSG), BoroPhosphoSilicate Glass (BPSG), Fluoride Silicate Glass (FSG), Spin On Glass (SOG), Tonen SilaZene (TOSZ), or combinations thereof.

The LED module 100 may include the first electrode 151 disposed on the first conductivity-type semiconductor layer 122 of the lower light emitting structure LS1, and the second electrode 152 disposed on the second conductivity-type semiconductor layer 127 of the upper light emitting structure LS2. The first electrode 151 may be connected to the first conductivity-type semiconductor layer 122 by penetrating through at least a portion of the gap-fill insulating film 140 and the protective insulating film 131. As such, the first electrode 151 may be formed after the gap-fill insulating film 140 is formed.

The first electrode 151 may include, for example, at least one of aluminum (Al), gold (Au), chromium (Cr), nickel (Ni), titanium (Ti), and tin (Sn). The second electrode 152 may be formed of, for example, a reflective metal. For example, the second electrode 142 may include a material such as Ag, Ni, Al, Cr, rhodium (Rh), palladium (Pd), iridium (Ir), ruthenium (Ru), Mg, zinc (Zn), platinum (Pt), Au, or the like. The second electrode 142 may have a single layer, or a structure of two or more layers.

The LED module 100 may include a planarization insulating layer 161 disposed on the gap-fill insulating film 140 and having a substantially flat surface. The planarization insulating layer 161 may be formed to cover the first and second electrodes 151 and 152. The LED module 100 may include a reflective layer 175 disposed in the planarization insulating layer 161. The planarization insulating layer 161 may include a first insulating layer 161a disposed on the gap-fill insulating film 140 and covering the first and second electrodes 151 and 152, and a second insulating layer 161b disposed on the first insulating layer 161a and having a substantially flat surface. The reflective layer 175 may be disposed on the first insulating layer 161a and may be covered by the second insulating layer 161b.

The LED module 100 may further include first and second connection electrodes 181 and 182 that are respectively connected to the first and second electrodes 151 and 152 through the planarization insulating layer 161.

The first and second connection electrodes 181 and 182 may be exposed to the surface of the planarization insulating layer 161. The first and second connection electrodes 181 and 182 may have pad portions 181P and 182P exposed on the surface of the planarization insulating layer 161. Surfaces of the pad portions 181P and 182P may have substantially flat coplanar surfaces with the surfaces of the planarization insulating layer 161. The reflective layer 175 disposed in the planarization insulating layer 161 may have an open area to be electrically insulated from the first and second connection electrodes 181 and 182 (see FIGS. 11A and 11B). The first and second connection electrodes 181 and 182 may include, for example, copper or a copper-containing alloy. The first and second connection electrodes 181 and 182 may be formed, for example, using a dual damascene process.

The circuit board 200 may include a wiring layer 280 bonded to the planarization insulating layer 161 of the LED module 100, and a device layer 250 in which a driving circuit including a plurality of TFT cells 245 is implemented.

The device layer 250 may include a driving circuit including a semiconductor substrate 210 and a TFT cell 245 formed on the semiconductor substrate 210, an interconnection portion 242 electrically connected to the TFT cell 245, and an interlayer insulating film 241 disposed on the semiconductor substrate 210 to cover the driving circuit and the interconnection portion 242.

The semiconductor substrate 210 may include, for example, a semiconductor such as Si, or Ge, or a compound semiconductor such as SiGe, SiC, GaAs, InAs, or InP.

The wiring layer 280 may include a dielectric layer 281 disposed on the interlayer insulating film 241, and a metal wire 285 disposed on the dielectric layer 281 and connected to the interconnection portion 242. The metal wire 285 may be electrically connected to the driving circuit through the interconnection portion 242. The dielectric layer 281 may have a substantially flat surface in contact with the surface of the planarization insulating layer 161. The planarization insulating layer 161 of the LED module 100 may be referred to as a "first planarization layer", and the dielectric layer 281 of the circuit board 200 may be referred to as a "second planarization layer".

The metal wire 285 may have a bonding pad 185P exposed on the surface of the dielectric layer 281. The bonding pad 185P may have a surface that is substantially coplanar with the surface of the dielectric layer 281. The planar surface of the dielectric layer 281 may be bonded to the planar surface of the planarization insulating layer 161, and the bonding pads 185P may be bonded to the pad portions 181P and 182P of the first and second connection electrodes 181 and 182, respectively. The bonding pads 185P and the pad portions 181P and 182P of the first and second connection electrodes 181 and 182 may have substantially the same area at the same position.

The driving circuit including the plurality of TFT cells 245 implemented in the circuit board 200 may be a driving circuit controlling the driving of a pixel (or a sub pixel). The semiconductor substrate 210 may include a through electrode 263 such as a through-silicon via (TSV) connected to the driving circuit, and first and second wiring lines 261 and 262 connected to the through electrode. For example, drain regions of the TFT cells 245 may be connected to the first wiring line 261 through the through electrode 263, and the first wiring line 261 may be connected to the data line.

Source regions of the plurality of TFT cells 245 may be connected to one side electrodes of the plurality of LED cells C1, C2, and C3 through interconnection portions 242 and the metal wires 285. Gate electrodes of the plurality of TFT cells 245 may be connected to the second wiring line 262 through the through electrode 263, and the second wiring line 262 may be connected by a gate line. The circuit configuration and operations thereof will be described below with reference to FIG. 4.

Figure 4:
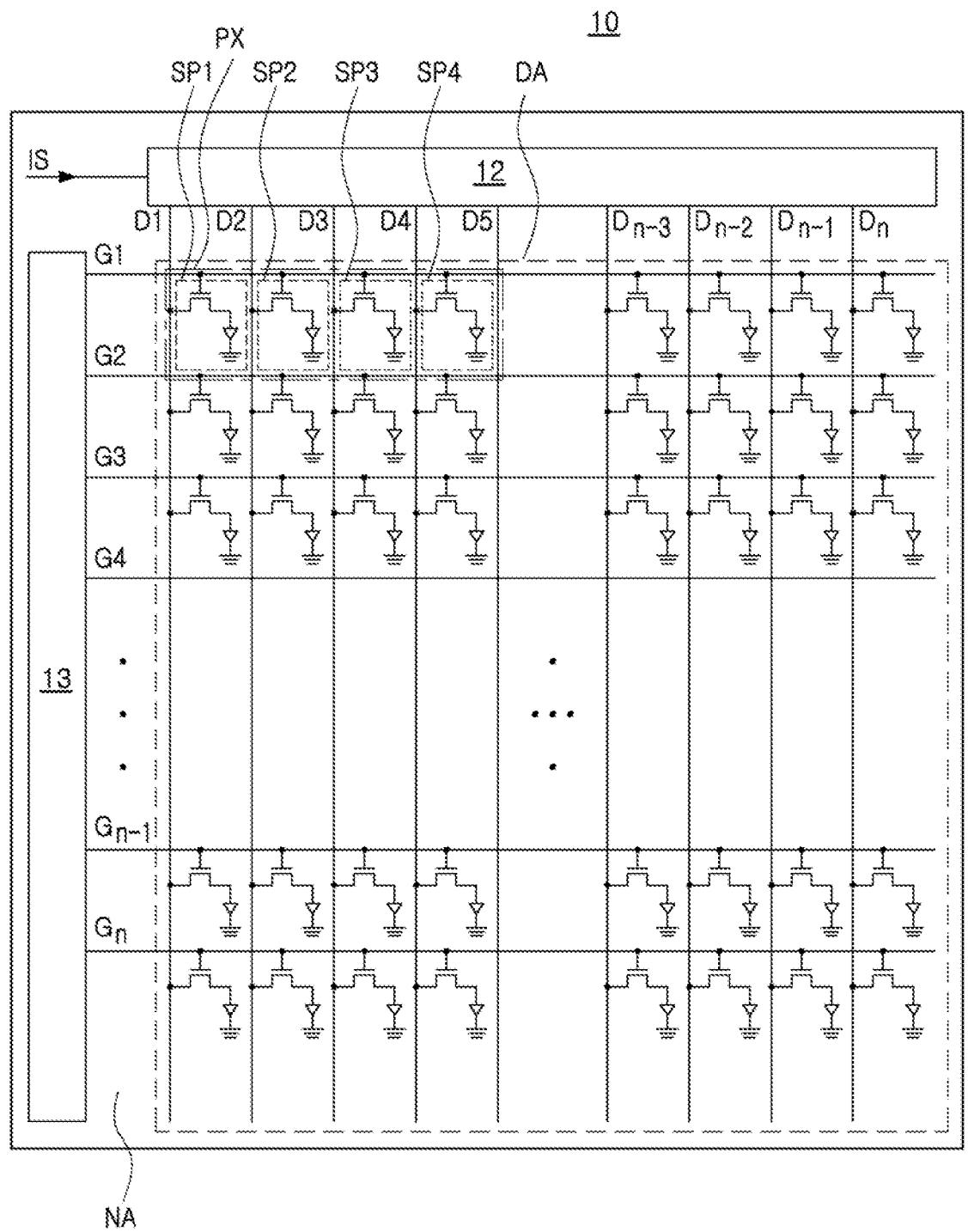
FIG. 4 is a schematic of a driving circuit implemented in a display device according to an example embodiment.

FIG. 4 is a driving circuit diagram implemented in a display device according to an example embodiment.

Referring to FIG. 4, a circuit diagram of a display panel 10 in which n×n sub-pixels are arranged is illustrated. The first to fourth sub-pixels SP1, SP2, SP3, and SP4 may receive data signals through data lines D1 to Dn, which are paths in a vertical direction (a row direction), respectively. The first to fourth sub-pixels SP1, SP2, SP3, and SP4 may receive a control signal (e.g., a gate signal) through gate lines G1 to Gn that are horizontal paths (in a column direction).

The first to fourth sub-pixels SP1, SP2, SP3, and SP4 may be arranged in a rectangular arrangement or another form. A plurality of pixels PX including the first to fourth sub-pixels SP1, SP2, SP3, and SP4 respectively form an active area DA for display and serve as a display area for a user. An inactive area NA of the display panel 10 may be formed along one or more edges of the active area DA. The inactive area NA does not have the pixel PX along the outer circumference of the display panel 10 and may correspond to the frame 11 of the display panel 10.

First and second driver circuits 12 and 13 may be employed to control the operation of the pixel PX, for example, the plurality of sub pixels SP1, SP2, SP3, and SP4. Some or all of the first and second driver circuits 12 and 13 may be implemented in a device layer 250 of the circuit board 200. The first and second driver circuits 12 and 13 may be formed as integrated circuits, thin film transistor panel circuits, or other suitable circuits, and may be disposed in the inactive area NA of the display panel 10. The first and second driver circuits 12 and 13 may include a microprocessor, a memory such as a storage, a processing circuit, and a communication circuit. During operation, the system control circuit may supply image information IS to be displayed on the display panel 10 to the first and second driver circuits 12, 13.

To display an image on the pixel PX, the first driver circuit 12 may supply the image data to the data lines D1 to Dn, and may send a clock signal and other control signals to the second driver circuit 13 (also referred to as a 'gate driver circuit'). The second driver circuit 13 may be implemented using an integrated circuit and/or a thin film transistor circuit. Gate signals controlling the sub-pixels SP1, SP2, SP3, and SP4 arranged in the column direction may be transmitted through the gate lines G1 to Gn of the display device.

The sub-pixels SP1, SP2, SP3, and SP4 may include TFT cells 245 (also referred to as a driving transistor) connected to the LED cells C1, C2, C3, and C4 in series, respectively. The sub-pixels may be provided in a different circuit configuration of respective sub-pixels SP1, SP2, SP3, and SP4. Respective sub-pixel SP1, SP2, SP3, and SP4 may be implemented in various circuits by further including other elements. For example, the respective sub-pixels SP1, SP2, SP3, and SP4 may further include a capacitor used to store the loaded data between successive image frames, or one or more switching transistors to support data loading operations and other operations.

FIGS. 5A to 12A are plan views of stages in a method of fabricating an LED module according to an example embodiment, and FIGS. 5B to 12B are cutaway cross-sectional views taken along line II-II' of FIGS. 5A to 12A.

Figure 5A:
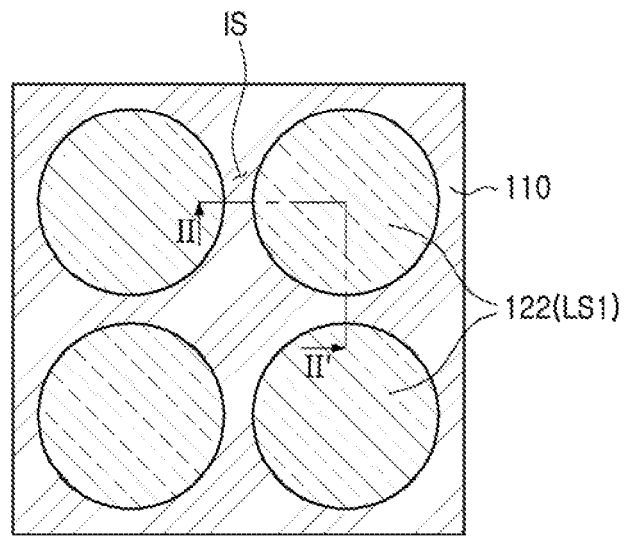
Figure 5B:
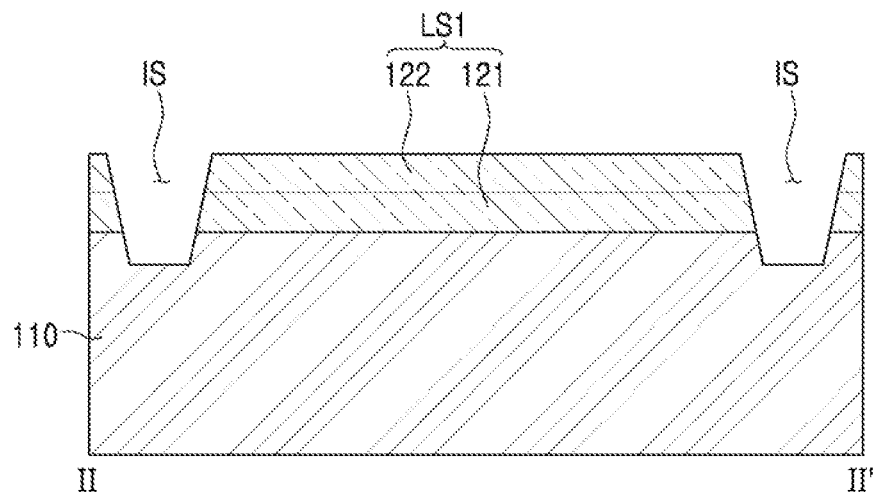

Referring to FIGS. 5A and 5B, in a method of fabricating an LED module according to an example embodiment, the undoped semiconductor layer 121 and a first conductivity-type semiconductor layer 122 may be sequentially grown on a growth substrate 110. The undoped semiconductor layer 121 and the first conductivity-type semiconductor layer 122 may be divided into a plurality of lower light emitting structures LS1 by forming an isolation region IS.

The growth substrate 110 may include, for example, an insulating, conductive, or semiconductor substrate, for example, a silicon substrate. The undoped semiconductor layer 121 and the first conductivity-type semiconductor layer 122 may include, for example, an undoped GaN layer and an n-type nitride layer, respectively.

The isolation region IS may be formed to expose the surface of the substrate 110. In the process of forming the isolation region IS, a portion of the substrate 110 may also be etched. As illustrated in FIG. 5A, the plurality of lower light emitting structures LS1 may be disposed in a shape having a circular shape in a plan view. In other example embodiments the plurality of lower light emitting structures LS1 may have various other shapes, such as a quadrangular or hexagonal shape.

Figure 6A:
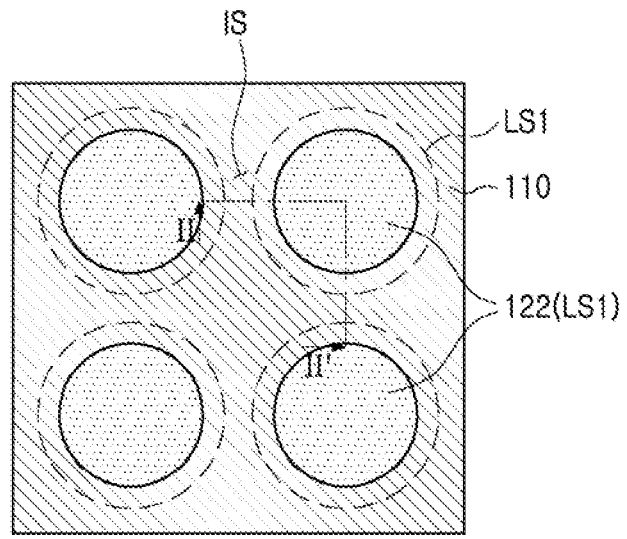
Figure 6B:
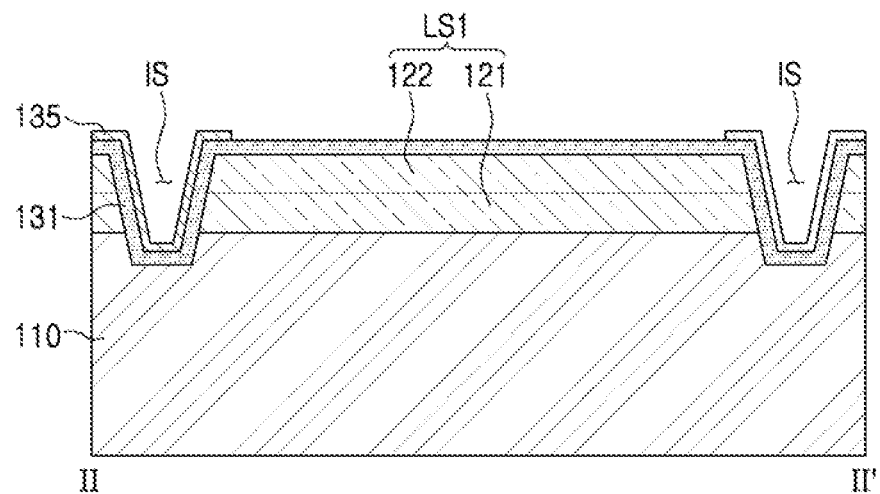

Referring to FIGS. 6A and 6B, a protective insulating film 131 may be formed on upper and side surfaces of the plurality of lower light emitting structures LS1, and then, a light blocking film 135 may be formed in the region of the protective insulating film 131 corresponding to the isolation region IS.

The protective insulating film 131 may extend to the surface area of the substrate 110 positioned between the lower light emitting structures LS1 along the side surface of the lower light emitting structure LS1. The protective insulating film 131 may include, for example, at least one of SiO, SiN, SiCN, SiOC, SiON, and SiOCN. The protective insulating film 131 may be formed relatively conformally.

The light blocking film 135 may be employed to prevent optical interference between a plurality of LED cells. The light blocking film 135 may include, for example, polysilicon. The light blocking film 135 may be formed of a light reflection layer. For example, the light blocking film 135 may include a reflective metal layer, a DBR layer, or an ODR layer. The reflective metal layer may include Ag, Ni, or Al.

Figure 7A:
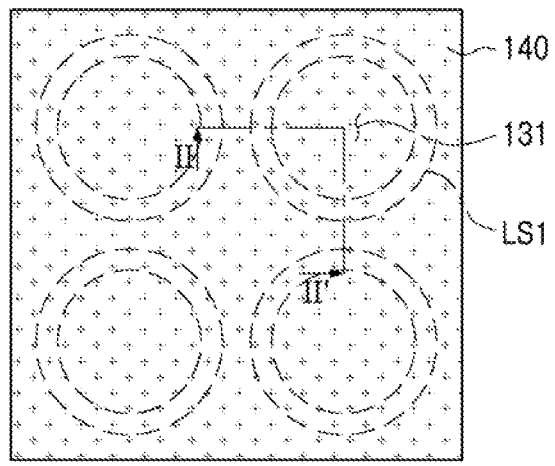
Figure 7B:
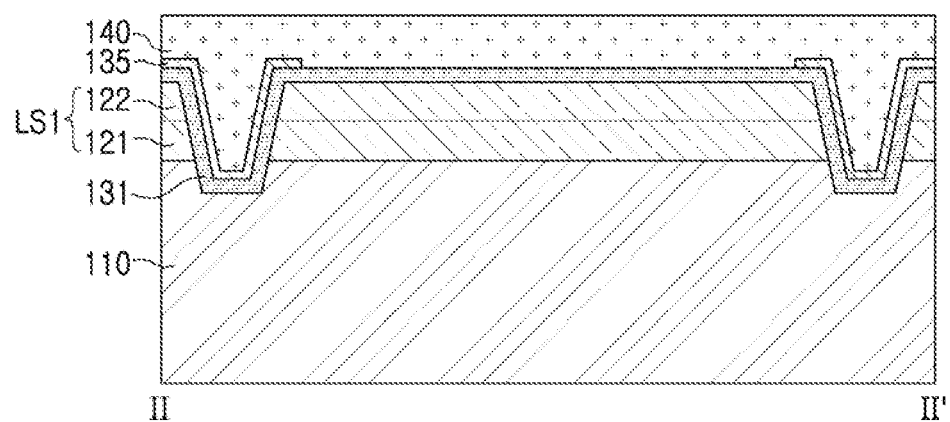

Referring to FIGS. 7A and 7B, a gap-fill insulating film 140 may be formed on the protective insulating film 131 to fill the isolation region IS. The gap-fill insulating film 140 may be disposed to contact the side surface of the upper light emitting structure LS2 and surround the upper light emitting structure LS2. The gap-fill insulating film 140 may include a silicon oxide or a silicon oxide-based insulating material, and may include, for example, TEOS, USG, PSG, BSG, BPSG, FSG, SOG, TOSZ, or combinations thereof.

The gap-fill insulating film 140 may be formed before first and second electrodes 151 and 152 and an active layer 165 are formed. Thus, the gap-fill insulating film 140 may be formed at a relatively high temperature of 600° C. or higher, for example, 800° C. In addition, the space between the lower light emitting structures LS1 may have a lower depth than that of the space between the entire light emitting structures LS. Thus, a relatively easy gap fill process may be performed.

Figure 8A:
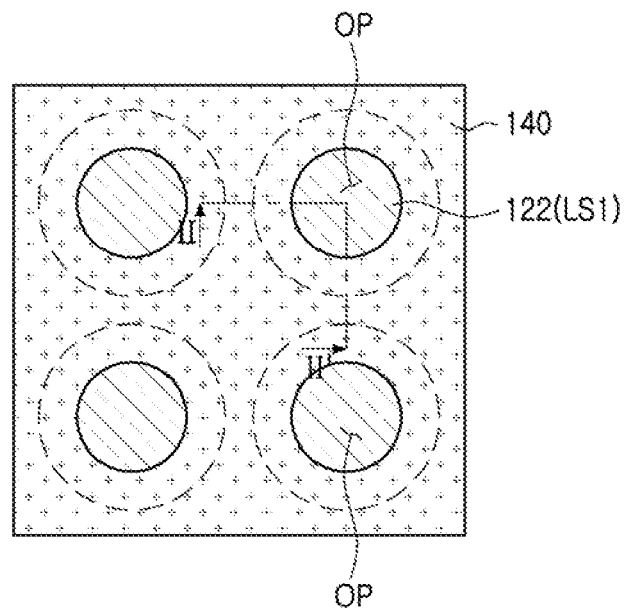
Figure 8B:
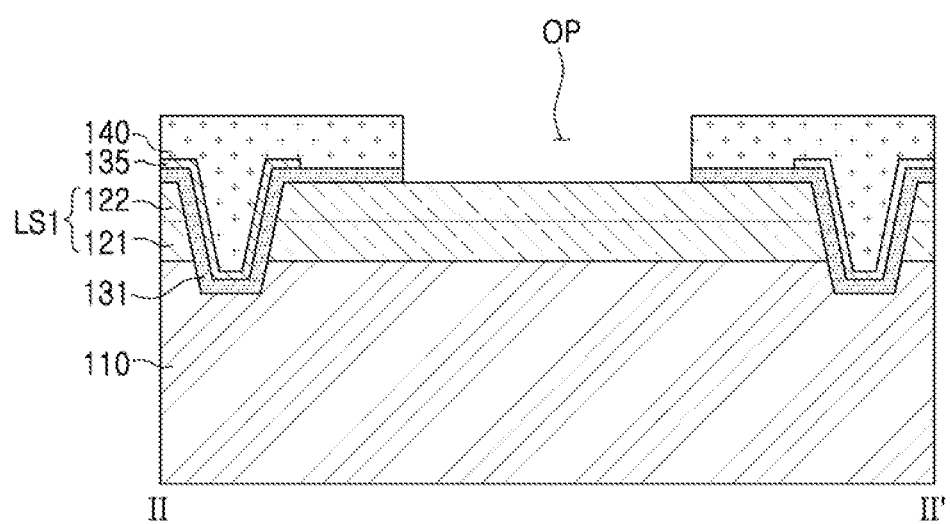

Referring to FIGS. 8A and 8B, an open area OP exposing a portion of the upper surface of each of the lower light emitting structures LS1 may be formed by partially removing the gap-fill insulating film 140 and the protective insulating film 131.

Figure 9A:
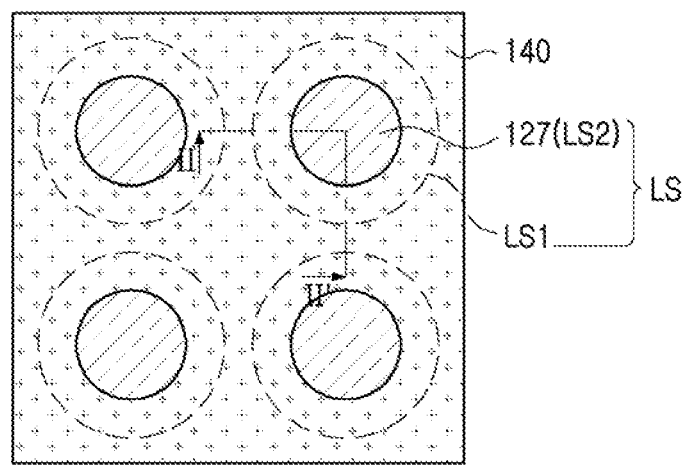
Figure 9B:
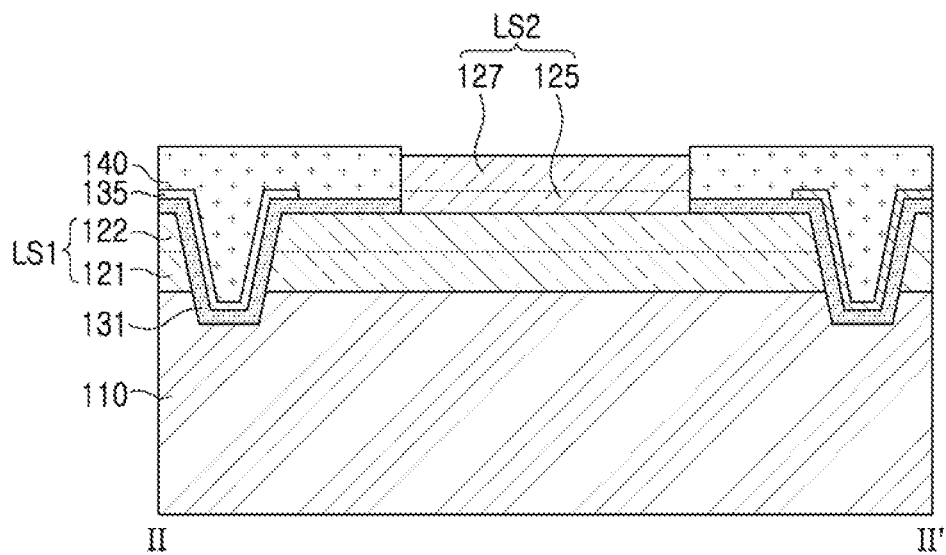

The upper region of the lower light emitting structure LS1 exposed by the open area OP may be provided as a region in which an upper light emitting structure LS2 of FIGS. 9A and 9B is to be formed in a subsequent process. In addition, the upper light emitting structure formed in a subsequent process may be defined by the open area OP. The position and area of the upper light emitting structure may be determined by the position and area of the open area OP. In addition, the side shape of the upper light emitting structure may be defined by the profile of the inner sidewall of the open area OP. For example, when the inner sidewall of the open area OP has a vertical or obtuse angle with respect to the upper surface of the lower light emitting structure LS1, the side surface of the upper light emitting structure may have the same inclination angle as the inner sidewall of the open area OP.

Referring to FIGS. 9A and 9B, the upper light emitting structure LS2 (having an active layer 125 and a second conductivity-type semiconductor layer 127) may be formed in an exposed area of the upper surface of the lower light emitting structure LS1.

The upper light emitting structure LS2 may be formed by sequentially growing the active layer 125 and the second conductivity-type semiconductor layer 127 in the upper region of the lower light emitting structure LS1 exposed by the open area OP. The upper light emitting structure LS2 may be grown such that an upper surface thereof has a level equal to or lower than an upper surface of the gap-fill insulating film 140.

As described above, the position, area, and sidewall shape of the upper light emitting structure LS2 may be determined by the position, area, and sidewall shape of the open area OP. In the present example embodiment, although the upper light emitting structure LS2 is illustrated as including the active layer 125 and the second conductivity-type semiconductor layer 127, the upper light emitting structure LS2 may also be formed by growing the active layer 125 and the second conductivity-type semiconductor layer 127 after further growing the first conductive semiconductor layer (see FIG. 17).

Figure 10A:
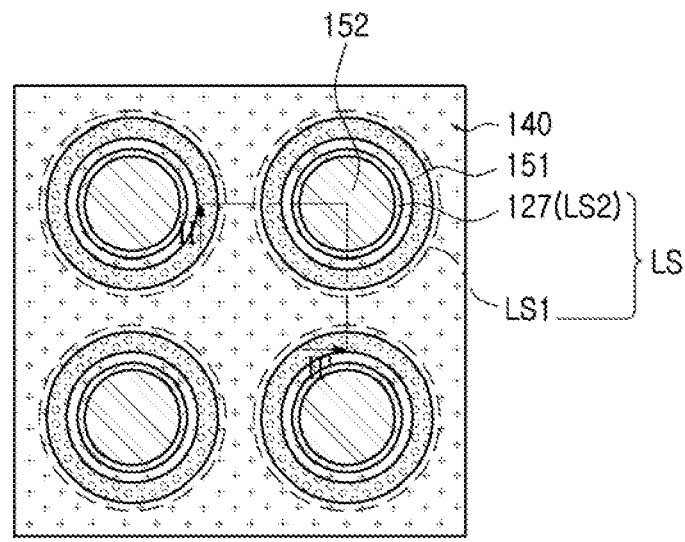
Figure 10B:
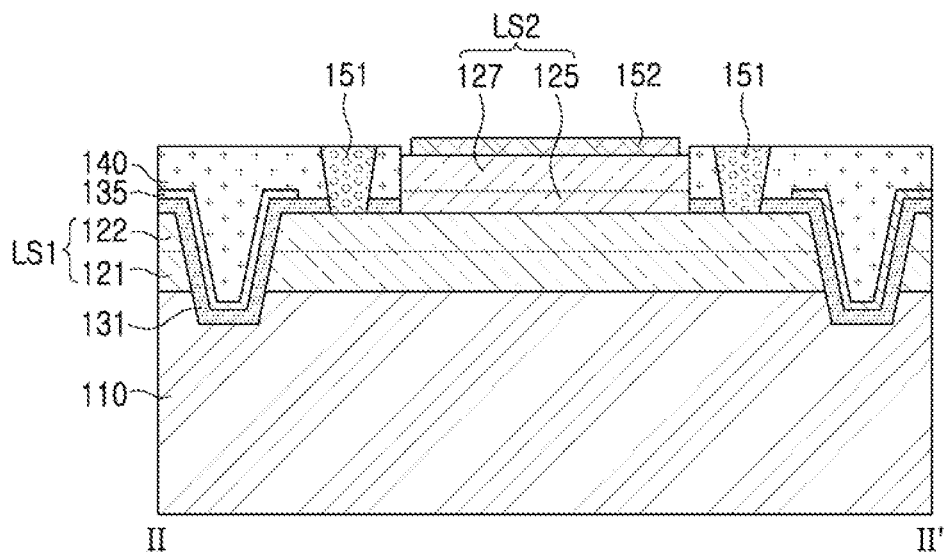

Referring to FIGS. 10A and 10B, the first electrode 151 and the second electrode 152, respectively connected to the first conductivity-type semiconductor layer 122 and the second conductivity-type semiconductor layer 127, may be formed.

The second electrode 152 may be formed on the second conductivity-type semiconductor layer 127 exposed by the open area OP, while the first electrode 151 may be formed by removing portions of the gap-fill insulating film 140 and the protective insulating film 131 to expose a portion of the first conductivity-type semiconductor layer 122. The first electrode 151 is illustrated as a ring shape surrounding the upper light emitting structure LS2. In another implementation, the first electrode 151 may be formed to be limited to a portion of the first conductive semiconductor layer 122. The first electrode 151 may include, for example, at least one of Al, Au, Cr, Ni, Ti, and Sn. The second electrode 152 may be formed of a reflective metal. For example, the second electrode 152 may include a material such as Ag, Ni, Al, Cr, Rh, Pd, Ir, Ru, Mg, Zn, Pt, Au, or the like, and may have a single layer or a structure of two or more layers.

Next, a planarization insulating layer 161 having a substantially flat surface may be formed on the gap-fill insulating film 140. As explained in detail below, the planarization insulating layer 161 may include first and second insulating layers 161a and 161b with a reflective layer 175 disposed between the first and second insulating layers 161a and 161b.

Figure 11A:
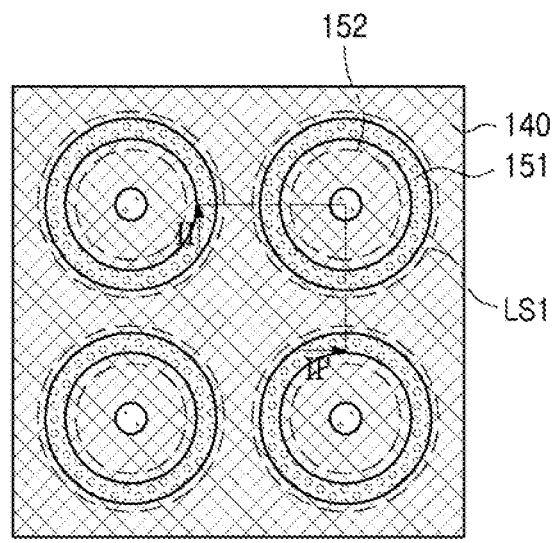
Figure 11B:
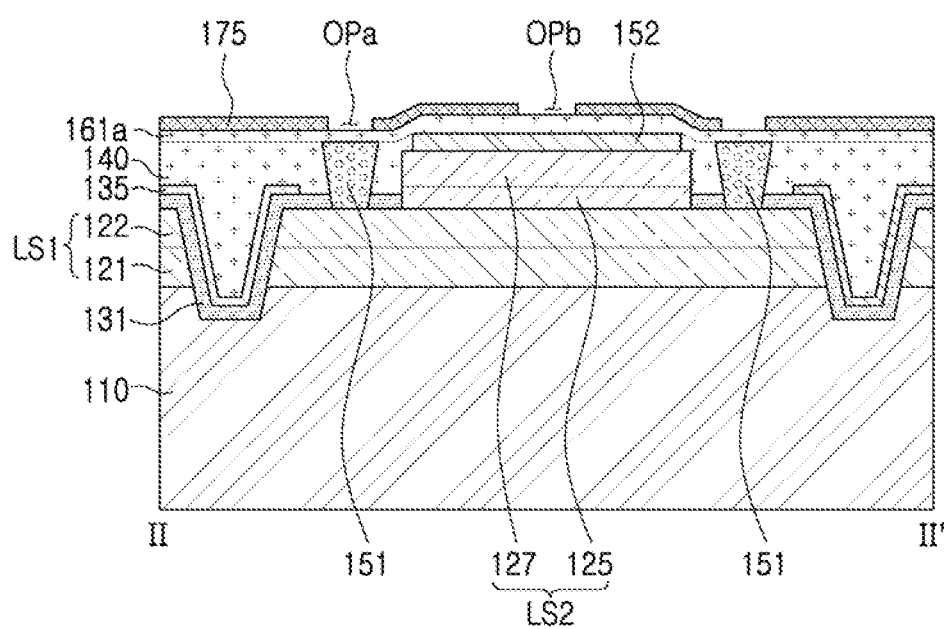

Referring to FIGS. 11A and 11B, the first insulating layer 161a may be formed on the gap-fill insulating film 140, and the reflective layer 175 may be formed on the first insulating layer 161a.

The first insulating layer 161a may be formed on the gap-fill insulating film 140 to cover the first and second electrodes 151 and 152. The first insulating layer 161a may include, for example, at least one of SiO, SiN, SiCN, SiOC, SiON, and SiOCN. The reflective layer 175 may include a reflective metal layer, a distributed Bragg reflection (DBR) layer, or an omnidirectional reflection (ODR) layer. The reflective metal layer may include, for example, Ag, Ni, or Al. When the reflective layer 175 includes a conductive layer, the first and second open areas OPa and OPb may be formed in regions corresponding to the first and second electrodes 151 and 152, respectively.

Figure 12A:
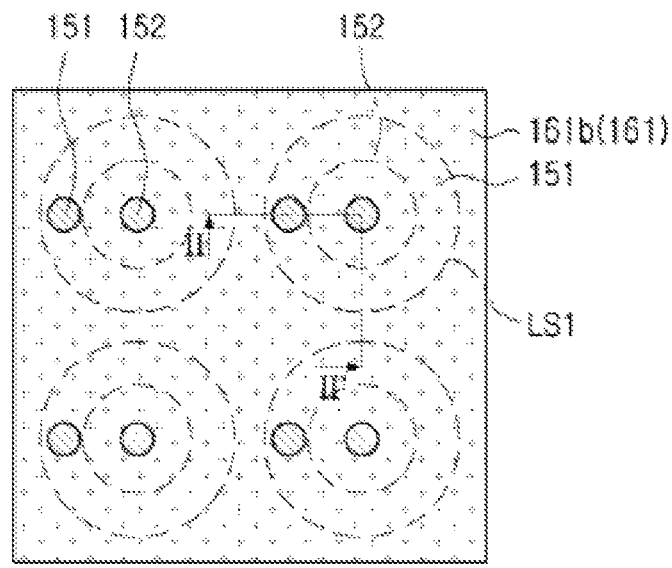
Figure 12B:
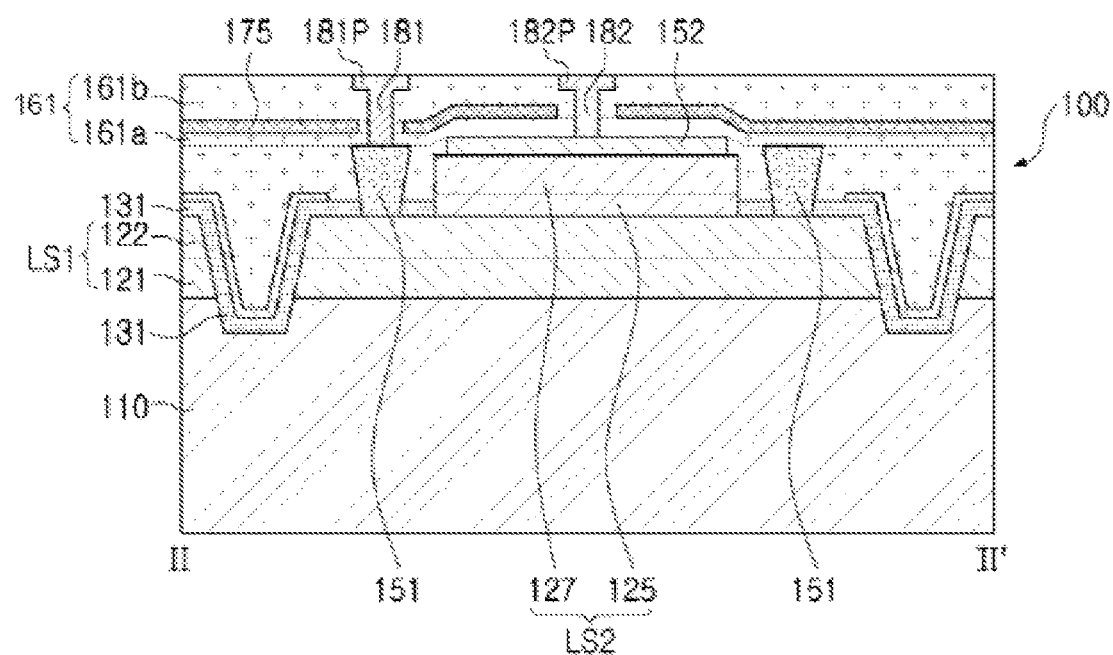

Referring to FIGS. 12A and 12B, the second insulating layer 161b may be formed on the first insulating layer 161a to cover the reflective layer 175, and then, the first and second connection electrodes 181 and 182 may be formed to be connected to the first and second electrodes 151 and 152, respectively.

The first and second connection electrodes 181 and 182 may be formed using, for example, a dual damascene process. The first and second connection electrodes 181 and 182 may have pad portions 181P and 182P exposed on the surface of the planarization insulating layer 161. The pad portions 181P and 182P may be configured such that contact areas of the first and second connection electrodes 181 and 182 may be extended.

After forming the first and second connection electrodes 181 and 182, the surface of the second insulating layer 161b may be planarized using a chemical mechanical polishing process (CMP). In this process, the surfaces of the first and second connection electrodes 181 and 182 may also be made substantially coplanar with the planarized surface of the second insulating layer 161b.

Figure 13:
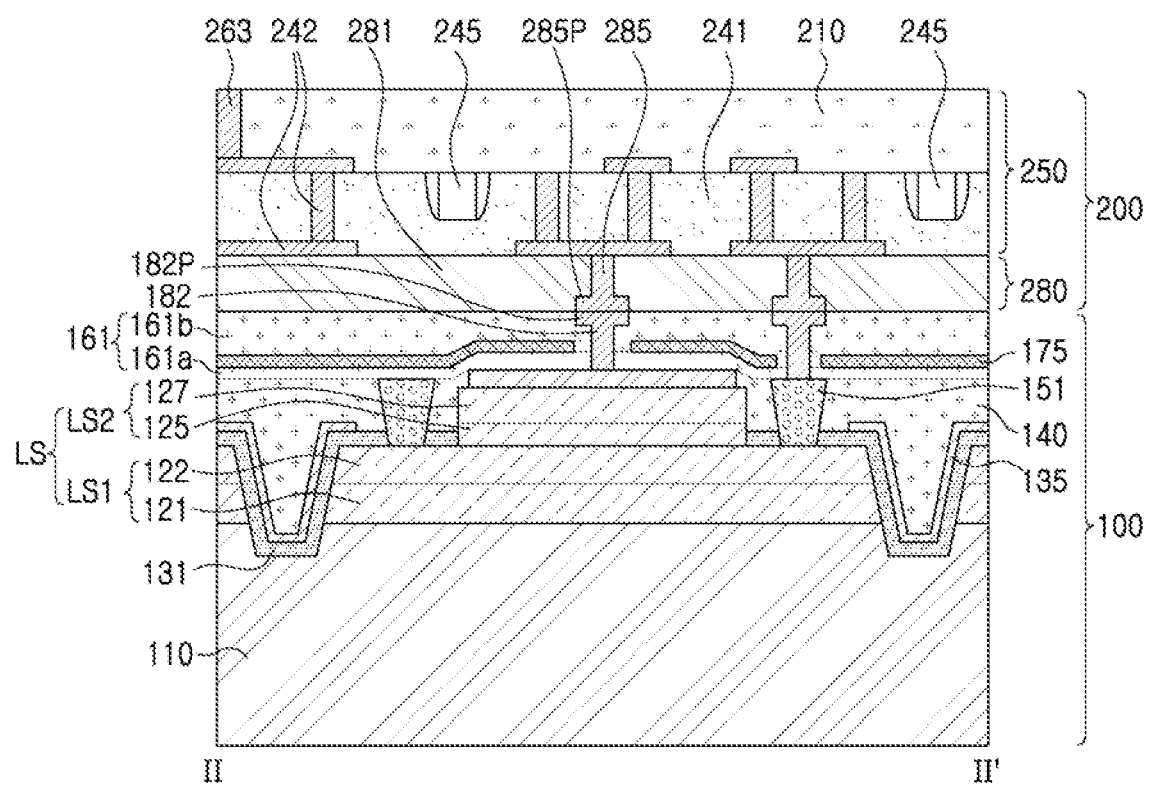
FIGS. 13 to 15 are cross-sectional views of stages in a method of fabricating an LED module according to an example embodiment.
Figure 14:
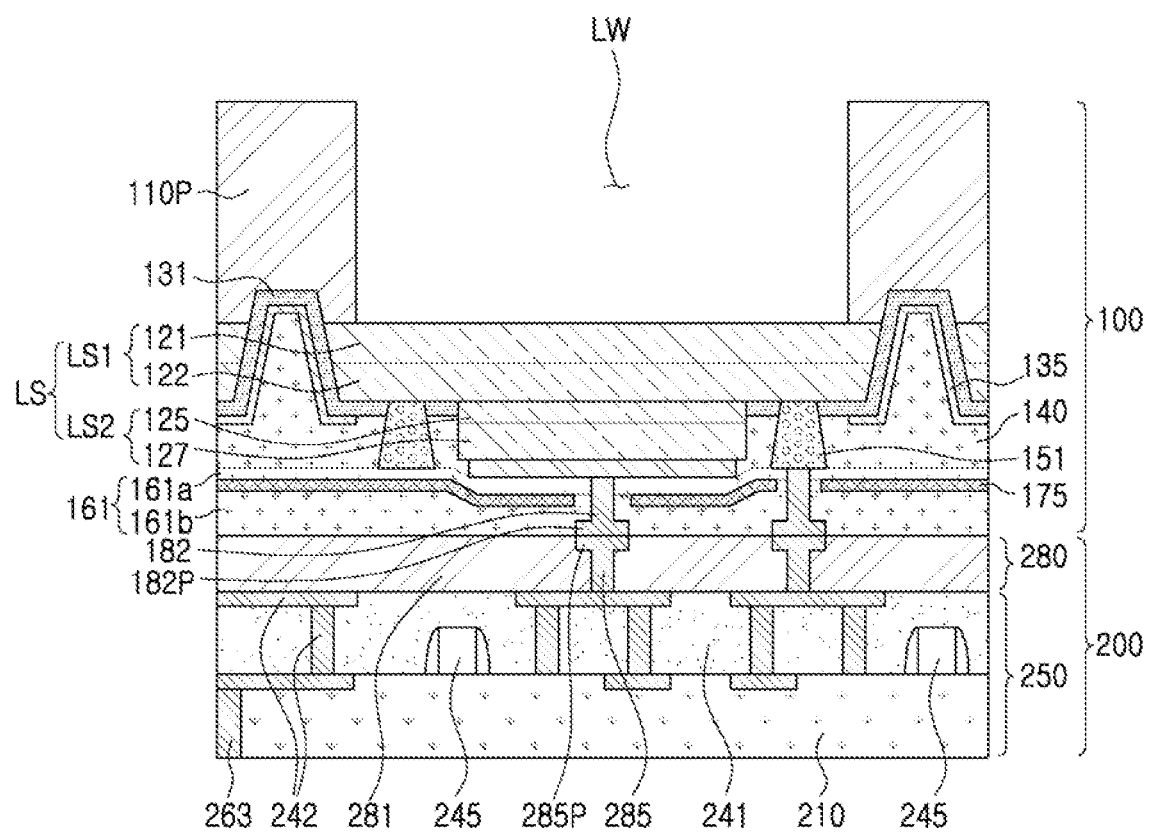
Figure 15:
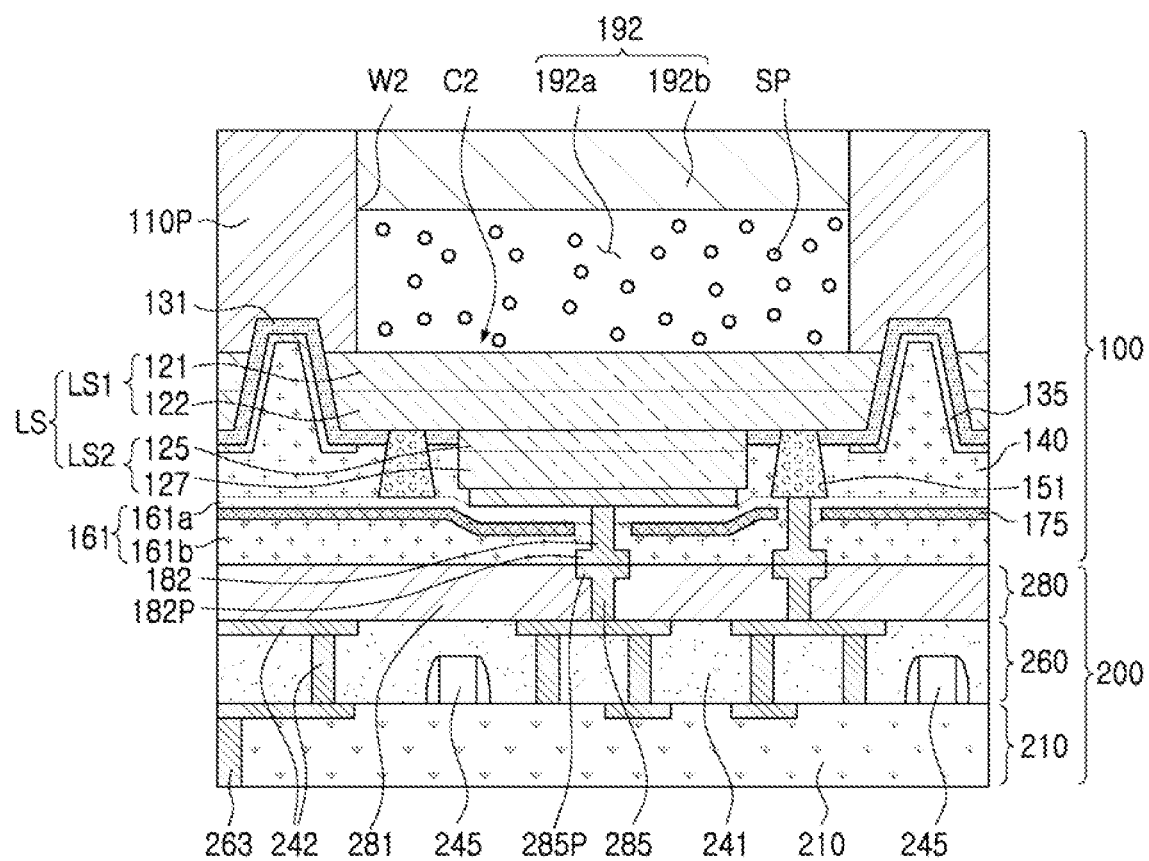

FIGS. 13 to 15 are cross-sectional views illustrating main processes of a bonding process and a wavelength conversion unit forming process in a method of fabricating an LED module according to an example embodiment. For convenience of description, a second sub-pixel SP2 is illustrated, but first, third, and fourth sub-pixels SP1, SP3, and SP4 may be formed in a similar manner. The configuration of the light emission window may be determined by the wavelength of the light of the first to fourth LED cells.

Figure 16:
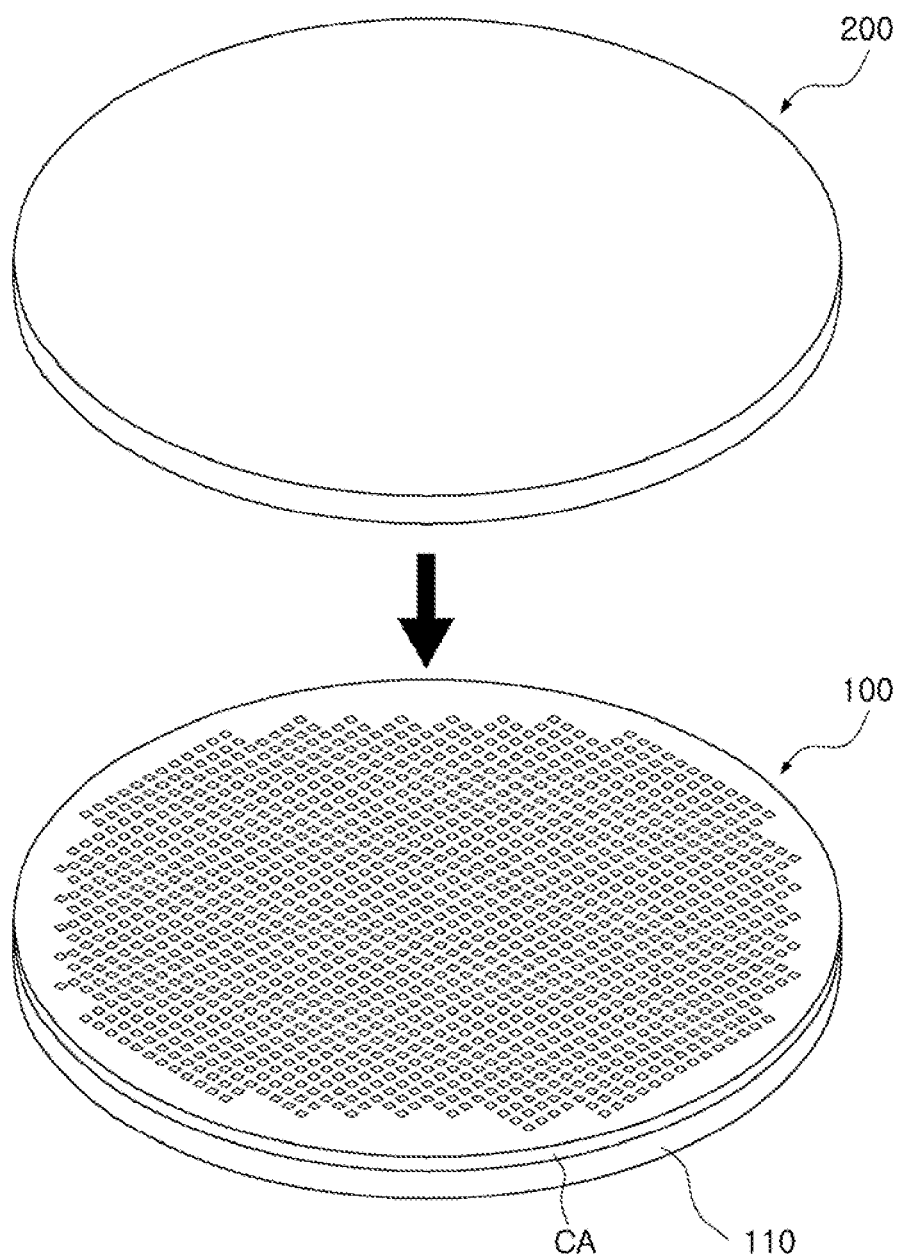
FIG. 16 is a schematic perspective view illustrating a bonding process of wafers (first and second substrate structures)

Referring to FIGS. 13 and 16, the LED module 100 and the circuit board 200 may be bonded such that the planarization insulating layer 161 of the LED module 100 and the dielectric layer 281 of the circuit board 200 face each other. The planarization insulating layer 161 and the dielectric layer 281 may be formed of the same material. For example, the planarization insulating layer 161 and the dielectric layer 281 may include silicon oxide. In the present example embodiment, the LED module 100 and the circuit board 200 are respectively formed of a wafer.

Referring to FIG. 16, wafer for the LED module 100 and the wafer for the circuit board 200 may be bonded to each other, i.e., wafer level bonding may be used to combine the LED module 100 with the circuit board 200. This bonding process may be performed using a wafer bonding process such as fusion bonding or hybrid bonding.

For example, the LED module 100 (which is the first substrate structure) and the circuit board 200 (which is the second substrate structure) may be disposed such that the planarization insulating layer 161 and a planarized surface of the dielectric layer 281 face each other, and may be disposed such that the pad portions 181P and 182P of the connection electrodes 181 and 182 and bonding pads 285P of the metal wire 285 correspond to each other, respectively. Subsequently, a high temperature annealing process may be performed while the planarization insulating layer 161 and the dielectric layer 281 are directly bonded to each other, and relatively stronger bond strength may be provided by covalent bonding. The insulating material forming the planarization insulating layer 161 and the dielectric layer 281 may include silicon oxide, or may include other suitable materials (e.g., SiCN) that may be bonded to each other. Also, in this process, the bonding pads 285P and the pad portions 181P and 182P formed of a metal such as copper may also be mechanically/electrically bonded.

Referring to FIG. 14, regions of the growth substrate 110 corresponding to the second LED cell C2 may be selectively etched to form a second light emission window W2. The process of forming the second light emission window W2 may be performed after grinding the growth substrate 110 to a predetermined thickness.

Referring to FIG. 15, a second wavelength conversion unit 192a may be formed by dispensing a light transmissive liquid resin (in which the wavelength conversion material P2 is mixed) into the second light emission window W2, respectively, and a second light adjusting unit 192 may be formed by adding a second filter layer 192b. As described above with reference to FIG. 3, similarly, a first light adjusting unit 191 having a first wavelength conversion unit 191a and a first filter layer 191b may be formed in the first light emission window W1, and partially lighted. A portion of the emission windows, for example, the third light emission window W3, may be configured to directly emit light emitted from the LED cell. Subsequently, by cutting into module units including a plurality of pixels by using a blade, the LED module 10 for display illustrated in FIGS. 1 and 2 may be manufactured.

As described above, the first substrate structure 100 providing the LED module and the circuit board 200 as the second substrate structure including the TFT cell 245 may be bonded to each other, and then, the bonded substrate structure may be cut into module units. Therefore, a display module including a plurality of pixels may be easily manufactured at the wafer level. In addition, a high resolution display module including a plurality of pixels may be provided. Thus, the time required for transferring a pixel unit in a manufacturing process of a display device using a micro LED may be significantly reduced.

Also, as described above, the gap-fill insulating film may effectively fill the space between the plurality of LED cells by forming a light emitting structure for the plurality of LED cells in a divided growth method, thereby significantly improving the reliability in the planarization process.

Figure 17:
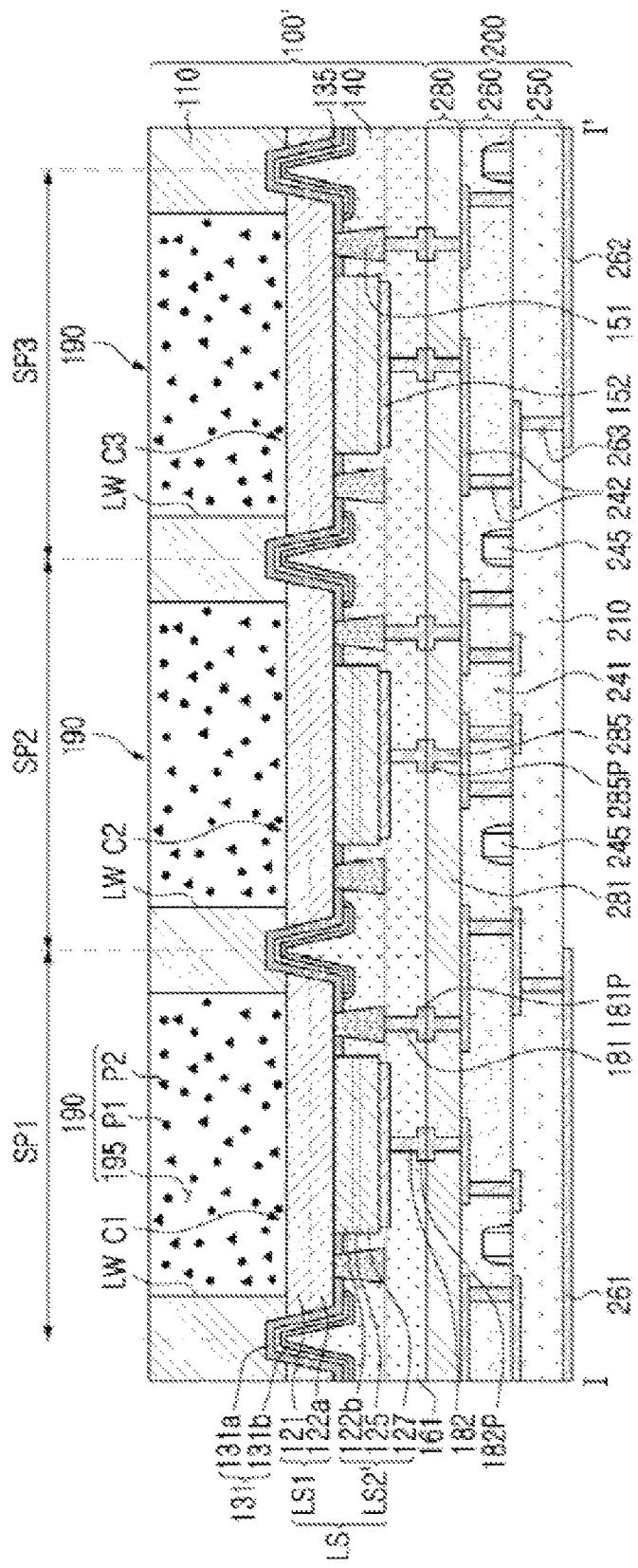
FIG. 17 is a cross-sectional view of an LED module for display according to an example embodiment.

FIG. 17 is a cross-sectional view illustrating an LED module for display according to an example embodiment.

Referring to FIG. 17, an LED module for display (or a display panel) according to the present example embodiment may be similar to the LED module for display illustrated in FIG. 3, except that the cover insulating film 131b protecting the light blocking film 135 is provided while a separate reflective layer (175 in FIG. 3) is not introduced, the divided growth process for the light emitting structure LS is changed, and respective sub-pixels SP1, SP2 and SP3 are configured to emit white light. In addition, the components of this embodiment may be understood with reference to the description of the same or similar components of the LED module for display illustrated in FIG. 3 unless otherwise stated.

In the present example embodiment, the LED module 100 may include a cover insulating film 131b protecting the light blocking film 135 disposed in the protective insulating film (131a) region that is located in the space between the plurality of LED cells C1, C2, and C3, for example, in the isolation region. The cover insulating film 131b may prevent the elements of the light blocking film 135 from being diffused into the gap-fill insulating film in a subsequent process. The cover insulating film 131b may include the same material as the protective insulating film 131a. For example, the cover insulating film 131b may include at least one of SiO, SiN, SiCN, SiOC, SiON, and SiOCN.

On the other hand, unlike the previous embodiment, a separate reflective layer 175 (see FIG. 3) may not be introduced into the planarization insulating layer 161. Also in the present example embodiment, the second electrode 152 and the light blocking film 135 may be configured to have light reflectivity, to replace a separate reflective layer.

In the present example embodiment, the light emitting structure LS may be grown by a divided growth process having conditions different from those described above. The lower light emitting structure LS1 may include an undoped semiconductor layer 121 and a first conductivity-type lower semiconductor layer 122a, while the upper light emitting structure LS2' may include a first conductivity-type upper semiconductor layer 122b, an active layer 125, and a second conductivity-type semiconductor layer 127, sequentially formed in one region of an upper surface of the lower light emitting structure LS1. In the present example embodiment, the active layer 125 may be formed on the first conductivity-type upper semiconductor layer 122b to be regrown. Thus, relatively excellent crystallinity may be expected.

Respective sub-pixels SP1, SP2, and SP3 employed in the present example embodiment may be configured to emit white light. The active layer 125 may be configured to emit blue light (e.g., of 440 nm to 460 nm) or ultraviolet or near ultraviolet light (e.g., of 380 nm to 440 nm), and a wavelength conversion unit 190 disposed in the respective light emission windows LW may be configured to emit white light by a light transmissive resin 195 and at least one or more wavelength conversion materials P1 and P2 mixed in the resin.

In another example embodiment, the active layer 125 may be configured to emit blue light, and first and second wavelength conversion materials P1 and P2 of the wavelength conversion unit 190 may include green and red phosphors, respectively. In this case, a color filter array may be introduced on an upper portion of the display LED module to emit blue, green and red colors from respective sub-pixels SP1, SP2 and SP3.

Figure 18:
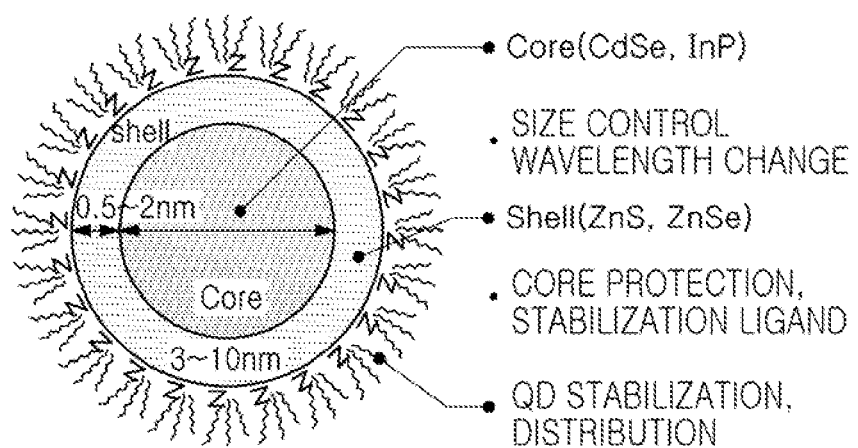
FIG. 18 is a schematic diagram illustrating a cross-sectional structure of a quantum dot (QD) as a wavelength conversion material usable in an LED module according to an example embodiment.

FIG. 18 is a schematic diagram illustrating a cross-sectional structure of a quantum dot (QD) as a wavelength conversion material usable in an LED module according to an example embodiment.

Referring to FIG. 18, the quantum dot QD may have a core-shell structure using a III-V or II-VI compound semiconductor. For example, the quantum dot QD may have a core such as CdSe, InP or the like, and a shell such as ZnS or ZnSe. The quantum dot may include a ligand for stabilizing the core and the shell.

The core diameter may be, for example, 1 to 30 nm or 3 to 10 nm, and the shell thickness may be 0.1 to 20 nm or 0.5 to 2 nm. The quantum dot may implement various colors depending on the size. When used as a phosphor substitute material, the quantum dot may be used instead of a red or green phosphor. In the case of using a quantum dot, a narrow full-width at half-maximum (e.g., of about 35 nm) may be implemented.

As set forth above, by forming a light emitting structure for a plurality of LED cells in a divided growth method, a gap-fill insulating film may be effectively filled in the space between the plurality of LED cells, and the reliability of a planarization process may be improved. As a result, a circuit board (or a second substrate structure) having a TFT cell at a wafer level and a substrate (or a first substrate structure) on which a plurality of LED cells are formed may be firmly bonded.

As described above, embodiments may provide an LED module having a structure that may effectively fill the space between a plurality of LED cells. Embodiments may provide a method of fabricating an LED module, in which a space between a plurality of LED cells may be effectively filled to improve reliability of a planarization process.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A light emitting diode (LED) module, comprising:
   a substrate having a plurality of light emission windows;
   a plurality of LED cells disposed on the substrate to correspond to the plurality of light emission windows, respectively, the plurality of LED cells each including a lower light emitting structure and an upper light emitting structure, the lower light emitting structure having an upper surface divided into a first region and a second region and having at least a first conductivity-type semiconductor layer, the upper light emitting structure being disposed on the first region of the lower light emitting structure and having at least a second conductivity-type semiconductor layer, the plurality of LED cells including an active layer between the first conductivity-type semiconductor layer and the second conductivity-type semiconductor layer;
   a protective insulating film disposed on a side surface of the lower light emitting structure, on the second region of the upper surface of the lower light emitting structure, and in direct contact with a side surface of the upper light emitting structure;
   a light blocking film disposed on the protective insulating film, between the plurality of LED cells;
   a gap-fill insulating film disposed on the protective insulating film, the light blocking film being interposed between the protective insulating film and the gap-fill insulating film, the gap-fill insulating film being disposed to fill between the plurality of LED cells and in direct contact with the side surface of the upper light emitting structure;
   a first electrode connected to the first conductivity-type semiconductor layer of the lower light emitting structure; and
   a second electrode connected to the second conductivity-type semiconductor layer of the upper light emitting structure.

2. The LED module as claimed in claim 1, wherein the first electrode is connected to the first conductivity-type semiconductor layer through the protective insulating film and the gap-fill insulating film.

3. The LED module as claimed in claim 1, further comprising:
   a planarization insulating layer disposed on the gap-fill insulating film and having a substantially flat surface; and
   first and second connection electrodes connected to the first and second electrodes through the planarization insulating layer, respectively, and exposed to a surface of the planarization insulating layer.

4. The LED module as claimed in claim 3, further comprising a reflective layer disposed in the planarization insulating layer, the reflective layer being electrically insulated from the first and second connection electrodes.

5. The LED module as claimed in claim 1, wherein the light blocking film includes any one of polysilicon, a reflective metal layer, a distributed Bragg reflection layer, and an omnidirectional reflection layer.

6. The LED module as claimed in claim 1, wherein the light blocking film directly contacts the protective insulating film and the gap-fill insulating film.

7. The LED module as claimed in claim 1, further comprising a cover insulating film disposed on the protective insulating film and covering the light blocking film.

8. The LED module as claimed in claim 1, further comprising a plurality of wavelength conversion units disposed in at least a portion of the plurality of light emission windows and configured to convert light generated from the active layer to light having a different wavelength.

9. The LED module as claimed in claim 8, wherein the plurality of wavelength conversion units include a wavelength conversion unit emitting light of wavelengths of different colors.

10. The LED module as claimed in claim 1, wherein the lower light emitting structure further includes an undoped semiconductor layer disposed between the first conductivity-type semiconductor layer and the substrate.

11. The LED module as claimed in claim 1, wherein the active layer is a portion of the upper light emitting structure, and is located between the lower light emitting structure and the second conductivity-type semiconductor layer.

12. The LED module as claimed in claim 11, wherein the upper light emitting structure further includes an additional first conductivity-type semiconductor layer between the active layer and the lower light emitting structure.

13. A light emitting diode (LED) module, comprising:
   a first substrate structure including a substrate having a plurality of light emission windows, a plurality of LED cells disposed on the substrate to correspond to the plurality of light emission windows, respectively, a gap-fill insulating film filled between the plurality of LED cells and disposed on the plurality of LED cells, a first planarization insulating layer disposed on the gap-fill insulating film and having a first surface that is substantially flat, and connection electrodes connected to the plurality of LED cells through the first planarization insulating layer, respectively, and exposed to the first surface of the first planarization insulating layer; and
   a second substrate structure disposed on the first substrate structure, the second substrate structure including a second planarization insulating layer having a second surface that is substantially flat, the second surface being bonded to the first surface, the second substrate structure including a driving circuit having a plurality of TFT cells and metal wires connected to the driving circuit, exposed to the second surface of the second planarization insulating layer, and bonded to the connection electrodes, respectively, wherein:

the plurality of LED cells includes a lower light emitting structure and an upper light emitting structure, the lower light emitting structure having an upper surface divided into a first region and a second region and having a first conductivity-type semiconductor layer, the upper light emitting structure being disposed on the first region of the lower light emitting structure and having an active layer and a second conductivity-type semiconductor layer, the first substrate structure further includes a protective insulating film and a light blocking film between the plurality of LED cells, the protective insulating film being disposed on a side surface of the lower light emitting structure, on the second region of the upper surface of the lower light emitting structure, and in direct contact with a side surface of the upper light emitting structure, and the light blocking film being disposed on the protective insulating film, and the gap-fill insulating film is disposed on the protective insulating film, the light blocking film being interposed between the protective insulating film and the gap-fill insulating film, the gap-fill insulating film being disposed to surround the upper light emitting structure while being in direct contact with the side surface of the upper light emitting structure.

14. The LED module as claimed in claim 13, wherein an upper surface of the gap-fill insulating film has the same height as or is higher than an upper surface of the upper light emitting structure.

15. The LED module as claimed in claim 13, wherein the side surface of the upper light emitting structure has an inclination angle that is vertical or obtuse.

16. The LED module as claimed in claim 13, further comprising:

a first electrode connected to the first conductivity-type semiconductor layer of the lower light emitting structure and connected to a portion of the connection electrodes; and a second electrode connected to the second conductivity-type semiconductor layer of the upper light emitting structure and connected to another portion of the connection electrodes.

17. The LED module as claimed in claim 16, wherein the first electrode is connected to the first conductivity-type semiconductor layer through the protective insulating film and the gap-fill insulating film.

18. The LED module as claimed in claim 13, further comprising a reflective layer disposed in the first planarization insulating layer, the reflective layer being electrically insulated from the connection electrodes.

19. The LED module as claimed in claim 13, wherein:

the first substrate structure further includes a plurality of wavelength conversion units disposed in at least a portion of the plurality of light emission windows and configured to convert light generated from the active layer to light of a different wavelength, and the plurality of wavelength conversion units include wavelength conversion units emitting light of wavelengths of different colors.

20. A light emitting diode (LED) module, comprising:

a substrate having a plurality of light emission windows;

a plurality of LED cells disposed on the substrate to correspond to the plurality of light emission windows, respectively, the plurality of LED cells each including a first conductivity-type semiconductor layer having an upper surface divided into a first region and a second region, and an active layer and a second conductivity-type semiconductor layer sequentially stacked on the first region;

a protective insulating film disposed in direct contact with a side surface of the first conductivity-type semiconductor layer and on the second region of the upper surface of the first conductivity-type semiconductor layer;

a light blocking film disposed on the protective insulating film, between the plurality of LED cells; and a gap-fill insulating film disposed on the protective insulating film, the light blocking film being interposed between the protective insulating film and the gap-fill insulating film, the gap-fill insulating film filling between the plurality of LED cells and being in direct contact with side surfaces of the active layer and the second conductivity-type semiconductor layer.

* * * * *